United States Patent [19]

Kim

[11] Patent Number: 5,500,380

[45] Date of Patent: Mar. 19, 1996

[54] METHOD FOR FABRICATING THIN FILM TRANSISTOR

[75] Inventor: Dong G. Kim, Kyungki-do, Rep. of Korea

[73] Assignee: Goldstar Co., Ltd., Seoul, Rep. of Korea

[21] Appl. No.: 227,661

[22] Filed: Apr. 14, 1994

[30] Foreign Application Priority Data

Apr. 16, 1993 [KR] Rep. of Korea .................. 6431/1993 U

[51] Int. Cl.⁶ .......................... H01L 21/336; H01L 21/28
[52] U.S. Cl. ................... 437/409; 257/411; 437/241; 437/238
[58] Field of Search .................. 257/411; 437/238, 437/241, 101, 40

[56] References Cited

U.S. PATENT DOCUMENTS

| | | | |
|---|---|---|---|
| 4,905,066 | 2/1990 | Dohjo et al. .......................... | 257/411 |
| 5,272,360 | 12/1993 | Todoroki et al. ..................... | 257/60 |

FOREIGN PATENT DOCUMENTS

| | | | |
|---|---|---|---|
| 530051 | 3/1993 | European Pat. Off. . | |
| 60-241269 | 11/1985 | Japan . | |
| 1-268060 | 10/1989 | Japan ...................................... | 257/411 |
| 1-288828 | 11/1989 | Japan ...................................... | 257/411 |
| 3-283466 | 12/1991 | Japan ...................................... | 257/411 |
| 4-44274 | 2/1992 | Japan ...................................... | 257/411 |
| 4-157767 | 5/1992 | Japan ...................................... | 257/411 |
| 4-221854 | 8/1992 | Japan ...................................... | 257/411 |
| 5067786 | 3/1993 | Japan . | |
| 5055575 | 3/1993 | Japan . | |

OTHER PUBLICATIONS

He et al., "Channel Layer Surface Modifications in a–Si:H Thin Film Transistors With Oxide/Nitride Dielectric Layers", Mat. Res. Soc. Symp. Proc. vol. 282, 1993, pp. 505–510.

Luan et al., "Effect of $NH_3$ Plasma Treatment of Gate Nitride on the Performance of Amorphous Silicon Thin–Film Transistors", J. Appl. Phys., vol. 68, No. 7, 1 Oct. 1990, pp. 3445–3450.

Primary Examiner—Mary Wilczewski
Attorney, Agent, or Firm—John P. White

[57] ABSTRACT

The present invention relates to a method for fabricating an amorphous-silicon thin film transistor, which comprises the steps of forming a gate electrode having sloped edges on a substrate, depositing a silicon oxide film as a gate insulation film on the substrate on which the gate electrode is formed, performing a nitrogen plasma treatment process on the surface of the silicon oxide film to form a silicon nitride film at the surface of the gate insulation film and thus to form the gate insulation film completely, depositing an amorphous silicon film on the gate insulation film to form an active layer, depositing a n+ type amorphous silicon film over the entire exposed surface of the resulting structure to form an ohmic layer, etching the n+ type amorphous silicon film and the amorphous silicon film in this order to leave the n+ type amorphous silicon film and the amorphous silicon film only on a portion of the gate insulation layer, forming a source region and a drain region respectively only on portions of the n+ type amorphous silicon film corresponding to both edges of the gate electrode to expose the n+ type amorphous silicon film deposited between the source region and the drain region, removing the exposed portion of the n+ type amorphous silicon film, and forming a protection film over the whole surface of the substrate.

15 Claims, 2 Drawing Sheets

METHOD FOR FABRICATING THIN FILM TRANSISTOR

BACKGROUND OF THE INVENTION

The present invention relates to a method for fabricating an amorphous-silicon thin film transistor, and more particularly to a method for forming its gate insulation layer.

FIG. 1 and FIG. 2 show structures of conventional amorphous-silicon thin film transistors which form an active layer using an amorphous silicon.

FIG. 1 is an amorphous-silicon thin film transistor having a back channel etch type and FIG. 2 is an amorphous-silicon thin film transistor having an etch stopper type.

Referring to FIG. 1, a method for fabricating the conventional amorphous-silicon thin film transistor shown in FIG. 1 will be hereinafter described.

As shown in FIG. 1, a metal thin film is first deposited on a glass substrate 11 and then patterned by a photolithography and etch process to form a gate electrode having sloped edges and a fixed pattern.

A gate insulation layer 13 is formed on the glass substrate 11 on which the gate electrode 12 is formed.

At this time, the gate insulation film 13 is formed as a singe film, double-layered film or triple-layered film.

The single film of gate insulation film 13 is formed of a silicon nitride thin film(SiNx) which is deposited by a Plasma Enhanced Chemical Vapour Deposition(PECVD) method and the double-layered film of gate insulation film 13 is formed of an silicon oxide film(SiO2) which is deposited by a thermal chemical vapour deposition(CVD) method or a sputtering method and a silicon nitride film(SiNx) which is deposited by a PECVD method, that is, as the structure of SiO2/SiNx.

The triple-layered film of gate insulation film 13 is formed of a metal-oxide film, an silicon oxide film and a silicon nitride film, for example, as the structure of Al2O3/SiO2/SiNx or Ta2O5/SiO2/SiNx.

After the gate insulation film 13 is formed, as above-mentioned, an amorphous silicon film 14 is deposited on the gate insulation film 13 by a PECVD method as an active layer and a n+ type amorphous silicon film 15 is then deposited as an ohmic layer.

Thereafter, the amorphous silicon film 14 and the n+ amorphous silicon film 15 are patterned with a fixed pattern.

Subsequently, a metal is deposited and patterned to form source and drain electrodes 16 and the n+ type amorphous silicon film 15 is subjected to an etching process to remove the portion exposed between the source and drain regions 16.

Finally, a passivation film 17 is deposited over the glass substrate 11, thereby obtaining a TFT.

Referring to FIG. 2, a method for fabricating the conventional amorphous-silicon thin film transistor shown in FIG. 2 will be hereinafter described.

As shown in FIG. 2, a gate electrode having sloped edges 22 is formed on a glass substrate 21 and a gate insulation layer 23 is then formed on the glass substrate 21 where the gate electrode 22 is formed.

At this time, an amorphous silicon film 24 is deposited on the gate insulation layer 23 and an insulation layer 25 is then deposited on the amorphous silicon film 24 as an etch stopper layer.

The insulation film 25 is etched by a photolithography and etching process, so as to form a pattern on a portion of the amorphous silicon film 24 corresponding to the upper surface of the gate electrode 22.

Upon etching the portion of the n+ type amorphous-silicon film exposed between the source and drain electrodes, after forming them, the insulation film 25 serves as an etch stopper layer for preventing a portion of the amorphous silicon film 24 located under the n+ type amorphous silicon film from being etched.

Thereafter, a n+ type amorphous silicon film 26 is deposited over the glass substrate 21 and then the amorphous silicon film 24 and the n+ type amorphous silicon film 26 are etched in this order so as to remain the n+ type amorphous silicon film 26 and the amorphous silicon film 24 merely at the upper side of the gate electrode 22.

A metal is deposited over the glass substrate 21 and then subjected to a photolithography and etching process to form source and drain electrodes 27.

After the source and drain electrodes 27 are formed. a portion of the n+ type amorphous silicon film 26 exposed between the source and drain electrodes 27 is etched and removed using the remaining insulation film 25 as an etch stopper.

A passivation film 28 is finally formed over the whole surface of the glass substrate 21, thus obtaining an amorphous silicon TFT having an etch stopper type.

In fabricating the conventional thin film transistors, as above-mentioned, a silicon nitride film formed by a PECVD method is used with the structure of the single layer or the multi-layer as the gate insulation film.

The reason why the silicon nitride film is used as the gate insulation film is because the best boundary-characteristic between the gate insulation layer and the amorphous silicon film can be obtained upon forming the gate insulation film with a silicon nitride film, and also because the PECVD method for forming the gate insulation film is carried out at a low temperature of about 300 to 400 degrees C. and it is thus the most proper process in obtaining a good quality of silicon nitride thin film.

In case of forming a silicon nitride film with a PECVD method, however, there are disadvantages in that many particles may be generated during the PECVD process and moreover the failure rate of devices may be increased due to the generated particles since reaction of the gases used for PECVD is a plasma condition.

There are also disadvantages in that the fabrication speed is slow due to the characteristic of the PECVD method and the cost for fabricating thin film transistors gets increased since the apparatus for PECVD is expensive.

SUMMARY OF THE INVENTION

Therefore, an object of the invention is to solve the above-mentioned problems encountered in the prior art and to provide a method for fabricating an amorphous thin film transistor having a gate insulation layer which includes a silicon oxide film and a silicon nitride film formed at the surface of the silicon oxide film by a nitrogen plasma-treatment process, thereby enabling an improvement in TFT reliability and yield.

In accordance with the present invention, this object can be accomplished by providing a method for fabricating a thin film transistor, comprising the steps of:

forming a gate electrode having sloped edges on a substrate;

depositing an silicon oxide film as a gate insulation film on the substrate on which the gate electrode is formed;

performing a nitrogen plasma treatment process on the surface of the silicon oxide film to form a silicon nitride film at the surface of the gate insulation film and thus to form the gate insulation film completely;

depositing an amorphous silicon film on the gate insulation film to form an active layer;

depositing a n+ type amorphous silicon film over the entire exposed surface of the resulting structure to form an ohmic layer;

etching the n+ type amorphous silicon film and the amorphous silicon film in this order to leave the n+ type amorphous silicon film and the amorphous silicon film only on a portion of the gate insulation layer corresponding to the gate electrode;

forming a source region and a drain region respectively merely on portions of the n+ type amorphous silicon film corresponding to both edges of the gate electrode to expose the n+ type amorphous silicon film deposited between the source region and the drain region;

removing the exposed portion of the n+ type amorphous silicon film; and forming a protection film over the whole surface of the substrate.

DETAILED DESCRIPTION OF THE PREFERRED EMBODIMENT

Hereinafter, the present invention will be described in detail with reference to attached drawings.

Figure 1:
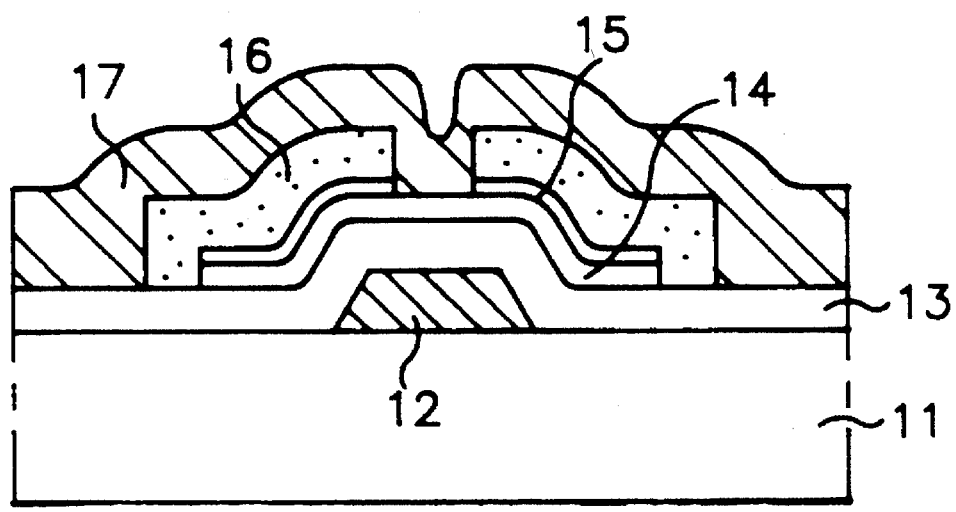
FIGS. 1 and 2 are sectional views showing structures of conventional amorphous silicon this film transistors.
Figure 2:
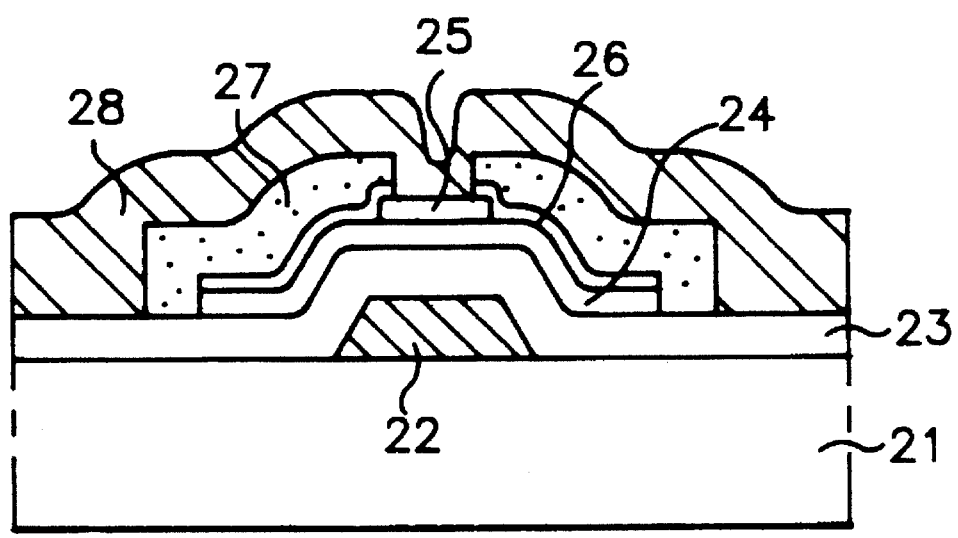

Structures of an amorphous silicon thin film transistor in accordance with the present invention are same as those of the conventional thin film transistors shown in FIGS. 1 and 2. However, methods for fabricating the amorphous silicon thin film transistor in accordance with the present invention are different from those of the conventional thin film transistors.

The method for fabricating a back channel etch type amorphous thin film transistor in accordance with one embodiment of the present invention will be hereinafter described.

As shown in FIG. 1, a thin metal film is deposited on a glass substrate 11 and then patterned to form a gate electrode 12.

A silicon oxide film is deposited on the glass substrate 11 on which the gate electrode 12 is formed, using a chemical vapour deposition(CVD) method under a high pressure or a sputtering method.

The silicon oxide film formed as above mentioned is plasma-treated in a vacuum chamber using $N_2$ or a gas containing N such as $N_2O$ and NO, SO as to form a silicon nitride film having a thickness less than 10 angstroms at the surface of the silicon oxide film.

Therefore, a gate insulation film 13 is comprised of silicon oxide film in which the silicon nitride thin film is formed at the surface of the silicon oxide film.

Thereafter, an amorphous silicon film 14 and a n+ type amorphous silicon film 15 are deposited on the gate insulation film 13 in this order and then patterned with a photolithography and etching process, so as to leave the n+ type amorphous silicon film 15 and the amorphous silicon film 14 only on a portion of the gate insulation layer 13 corresponding to the gate electrode 12.

Over the whole surface of the substrate, a thin metal film is deposited and then patterned to form source and drain electrodes 16, respectively, on both edges of the n+ type amorphous silicon film 15.

Subsequently, the n+ type amorphous silicon film 15 exposed between the source and drain electrodes 16 is etched to be removed there, thereby causing the amorphous silicon between the source and drain electrodes 16 to be exposed.

Finally, a protection film 17 is formed over the whole surface of the substrate, thereby completing the back channel etch type amorphous silicon thin film transistor of the present invention.

Hereinafter, a method for fabricating an etch stopper type amorphous silicon thin film transistor in accordance with the other embodiment of the present invention will be described.

As shown in FIG. 2, a thin metal film is first formed on a glass substrate 31 and then patterned to form a slope-shaped gate electrode 32.

An silicon oxide film is deposited as a gate insulation film 33, on the glass substrate 31 in which the gate electrode 32 is formed, using a CVD method under a high pressure or a sputtering method.

The silicon oxide film formed as above-mentioned is subjected to a plasma-treatment process in a vacuum chamber using $N_2$ or a gas containing N such as $N_2O$ and NO, so as to form a silicon nitride film having a thickness less than 10 angstroms at the surface of the silicon oxide film.

Therefore, the gate insulation film 33 is comprised of the silicon oxide film in which the silicon nitride film is formed at the surface of the silicon oxide film.

Thereafter, an amorphous silicon film 34 is deposited on the gate insulation film 33 and an insulation film 35 is deposited on the amorphous silicon film 34 as an etch stopper layer.

A photolithography and etching process is performed to remain the insulation film 35 merely on a portion of the amorphous silicon film 34 corresponding to the gate electrode 32.

A n+ type amorphous silicon film 36 is deposited on the whole surface of the amorphous silicon film 34 on which the insulation is formed and the n+ type amorphous silicon film 36 and the amorphous silicon film 34 are etched in this order to be removed of the region in which the insulation film 35 is not remained.

Over the whole surface of the substrate 31, a metal film is deposited and then patterned to form a source electrode and a drain electrode 37 respectively at both edges of the n+ type amorphous silicon film 36 remaining on the remaining insulation film 35 and thus to expose the n+ type amorphous silicon film 36 deposited between the source and drain electrodes 37.

The exposed n+ type amorphous silicon film 36 is removed to expose a portion of the remaining insulation film 35 deposited under it.

Over the whole surface of the glass substrate, a protection film 38 is finally formed, thereby resulting in the completion of an etch stopper type amorphous silicon thin film transistor.

Using XPS (X-ray photoelectron spectroscopy: ESCA), after the silicon oxide film is subjected to a plasma-treatment in a vacuum chamber to form a silicon nitride film at the surface of the silicon oxide film, the construction elements, composition ratio and the oxidation conditions of the construction elements in the gate insulation film have been analyzed.

Figure 3:
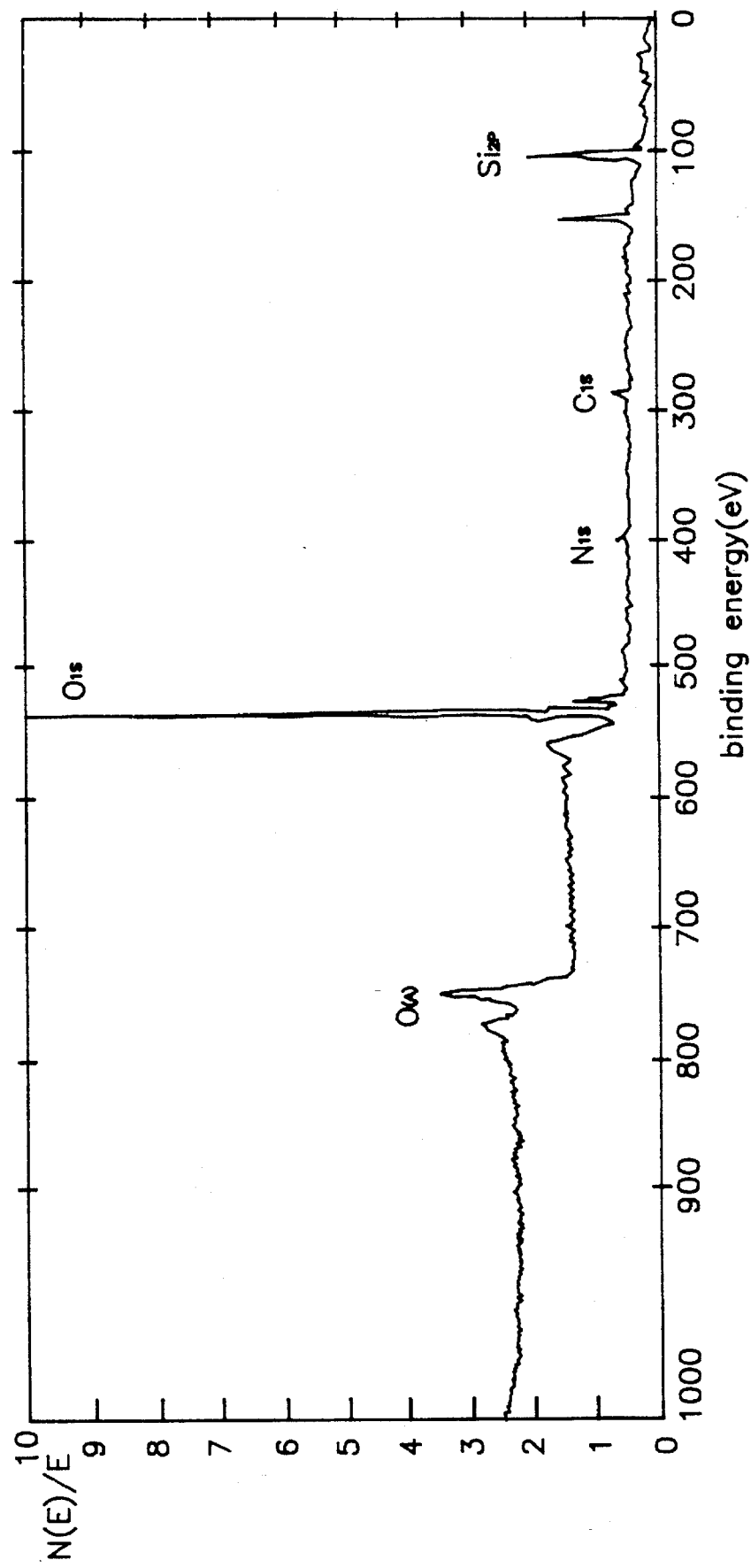
FIG. 3 is a graph showing the result of XPS analysis to the gate insulation film in accordance with the present invention.

FIG. 3 shows the analysis result.

Especially, FIG. 3 is to represent the analysis result under condition that the silicon oxide film is deposited by a CVD method under a high pressure at 430 degrees C. and then plasma treated with a nitride gas having power density of 32 mW/cm2.

According to FIG. 3, it can be found that nitride exists since the spectrum of nitride(Nis optical electron) appears at its binding energy near 400 eV.

By analyzing a narrow region near 400 eV, the binding energy of nitride spectrum has been observed as 398.5 eV. This means that nitrogen exists as a silicon oxide-nitride condition.

As a result of each element having a predetermined quantity being analyzed, the quantity of nitrogen has been determined to be about 4 atomic percent.

As a result of the concentration of nitrogen is measured varying corresponding to the power density of nitrogen plasma, the concentration of nitrogen has been varied between about 2 to 15 atomic percent.

If the silicon oxide film is treated with nitrogen gas plasma, as shown from the analysis results, the silicon oxide film is nitrized, thereby causing silicon nitride film or silicon oxide-nitride thin film to be formed.

Besides of the silicon oxide thin film deposited using a CVD method under a high pressure or a sputtering method, according to the present invention, an silicon oxide thin film deposited using a CVD method under a low pressure can be used as the gate insulation film.

Similarly to the silicon oxide film deposited using a CVD method under a high pressure, the silicon oxide film deposited using a CVD method under a low pressure can have a silicon nitride thin film at the surface of the silicon oxide film by performing a nitrogen plasma treatment.

According to the present invention, as above-mentioned, it is possible to improve the boundary condition between the gate insulation layer and the amorphous silicon film which is the active layer since the silicon oxide film in which the silicon nitride film is formed at its surface is used as the gate insulation film without using a silicon nitride thin film formed by a plasma enhanced CVD method as the gate insulation film.

Therefore, the thin film transistor in accordance with the present invention fabricated by the above-mentioned method has an electrical characteristic superior to that of the conventional thin film transistors which use a silicon nitride thin film deposited by a PECVD method as a gate insulation film.

Moreover, it is also possible to improve the reliability and yield of the device due to the superior electrical characteristic.

Upon depositing a silicon nitride film with a PECVD method as for the conventional gate insulation film, there is a probability that the failure of device may occur due to particles generated during the deposition process.

However, since the present invention uses an silicon oxide film deposited by a CVD method or a sputtering method, such failure can be decreased.

Since the present invention also forms the gate insulation film using a CVD method under a high pressure or a sputtering method, the cost for purchasing a process-apparatus can be reduced and the improvement of yield can be moreover expected.

What is claimed is:

1. A method for fabricating a thin film transistor, comprising the steps of:

forming a gate electrode having sloped edges on a substrate;

depositing a silicon oxide film as a gate insulation film on the substrate on which the gate electrode is formed;

performing a nitrogen plasma treatment process on the surface of the silicon oxide film to form a silicon nitride film at the surface of the gate insulation film and thus to form the gate insulation film completely;

depositing an amorphous silicon film on the gate insulation film to form an active layer;

depositing a n+ type amorphous silicon film over the amorphous silicon film to form an ohmic layer;

etching the n+ type amorphous silicon film and the amorphous silicon film in this order to leave the n+ type amorphous silicon film and the amorphous silicon film only on a portion of the gate insulation layer;

depositing a metal film on the n+ type amorphous silicon film and patterning said metal film to form source and drain electrodes;

removing a portion of the n+ type amorphous silicon film which is exposed between the source and drain electrodes; and forming a protection film over the whole surface of the substrate.

2. A method in accordance with claim 1, wherein said silicon oxide film is deposited by a CVD method under a high pressure or a sputtering method.

3. A method in accordance with claim 1, wherein said silicon oxide film is deposited by a CVD method under a low pressure.

4. A method in accordance with claim 1, wherein the thickness of said silicon nitride film formed on the surface of said silicon oxide film is under 10 angstroms.

5. A method in accordance with claim 1, wherein the nitrogen concentration in said silicon nitride film is 2 to 15 atomic percent.

6. A method in accordance with claim 1, wherein the nitrogen plasma treatment process is performed using a nitrogen gas or a gas containing nitrogen in a vacuum chamber.

7. A method in accordance with claim 6, wherein one of NO and $N_2O$ is used as the gas containing nitrogen.

8. A method for fabricating a thin film transistor, comprising the steps of:

forming a gate electrode having sloped edges on a substrate;

depositing a silicon oxide film as a gate insulation film on the substrate on which the gate electrode is formed;

performing a nitrogen plasma treatment process on the surface of the silicon oxide film to form a silicon nitride film at the surface of the silicon oxide film and thus to form the gate insulation film completely;

depositing an amorphous silicon film on the gate insulation film to form an active layer;

depositing an insulation layer on the amorphous silicon film and then performing a photolithography and etching process to leave the insulation layer only on the amorphous silicon corresponding to the gate electrode;

then depositing a n+ type amorphous silicon film on the entire exposed surface of the resulting structure to form an ohmic layer;

etching the n+ type amorphous silicon film and the amorphous silicon film in this order to leave the n+ type amorphous silicon film and the amorphous silicon film only on a portion of the gate insulation layer;

depositing a metal film on the n+ type amorphous silicon film and patterning said metal film to form source and drain electrodes;

removing a portion of the n+ type amorphous silicon film which is exposed between the source and drain electrodes to expose the remaining insulation layer; and forming a protection film over the whole surface of the substrate.

9. A method in accordance with claim 8, wherein said silicon oxide film is deposited by a CVD method under a high pressure or a sputtering method.

10. A method in accordance with claim 8, wherein said silicon oxide film is deposited by a CVD method under a low pressure.

11. A method in accordance with claim 8, wherein the thickness of said silicon nitride film formed on the surface of said silicon oxide film is under 10 angstroms.

12. A method in accordance with claim 8, wherein the nitrogen concentration in said silicon nitride film is 2 to 15 atomic percent.

13. A method in accordance with claim 8, wherein the nitrogen plasma treatment process is performed using a nitrogen gas or a gas containing nitrogen in a vacuum chamber.

14. A method in accordance with claim 13, wherein one of NO and $N_2O$ is used as the gas containing nitrogen.

15. A method in accordance with claim 8, wherein said insulation film serves as an etch stopper layer for preventing said amorphous silicon film located under said exposed n+ type amorphous silicon film from being etched upon etching said exposed portion of the n+ type amorphous silicon film.

* * * * *